United States Patent
Glukhoy

(10) Patent No.: US 6,803,585 B2
(45) Date of Patent: Oct. 12, 2004

(54) ELECTRON-CYCLOTRON RESONANCE TYPE ION BEAM SOURCE FOR ION IMPLANTER

(76) Inventor: Yuri Glukhoy, 440 Arguello Blvd. #1, San Francisco, CA (US) 94118

( * ) Notice: Subject to any disclaimer, the term of this patent is extended or adjusted under 35 U.S.C. 154(b) by 351 days.

(21) Appl. No.: 10/032,425

(22) Filed: Dec. 31, 2001

(65) Prior Publication Data

US 2003/0234369 A1 Dec. 25, 2003

Related U.S. Application Data

(63) Continuation of application No. 09/476,529, filed on Jan. 3, 2000, now abandoned.

(51) Int. Cl.[7] .......................... H01J 27/00; C23C 14/34
(52) U.S. Cl. .............................. 250/423 R; 204/192.15
(58) Field of Search .................. 250/423 R, 492.21, 250/396 R, 432 R, 424, 492.2; 156/643.1, 345; 315/111.41; 204/192.15, 192.17

(56) References Cited

U.S. PATENT DOCUMENTS

| | | | | |
|---|---|---|---|---|
| 5,061,838 A | * | 10/1991 | Lane et al. ............. | 219/121.59 |
| 5,453,305 A | * | 9/1995 | Lee ......................... | 427/562 |
| 5,707,486 A | * | 1/1998 | Collins ................. | 156/345.38 |
| 5,760,405 A | * | 6/1998 | King et al. ............. | 250/423 R |
| 5,874,706 A | * | 2/1999 | Ishii et al. ............. | 219/121.43 |
| 6,068,784 A | * | 5/2000 | Collins et al. ................ | 216/68 |
| 6,132,564 A | * | 10/2000 | Licata .................... | 204/192.15 |
| 6,294,862 B1 | * | 9/2001 | Brailove et al. ......... | 313/363.1 |
| 6,300,227 B1 | * | 10/2001 | Liu et al. .................... | 438/513 |
| 6,418,874 B1 | * | 7/2002 | Cox et al. ................. | 118/723 I |
| 6,444,137 B1 | * | 9/2002 | Collins et al. ................ | 216/79 |
| 6,703,628 B2 | * | 3/2004 | Ye et al. ................. | 250/492.21 |
| 6,755,150 B2 | * | 6/2004 | Lai et al. ................... | 118/723 I |

* cited by examiner

Primary Examiner—Wilson Lee
Assistant Examiner—Chuc Tran

(57) ABSTRACT

An ECR ion-beam source for use in an ion implanter has a sealed plasma chamber in which plasma is excited by microwave radiation of 2.45 GHz in combination with an external magnetic field generated by permanent magnets surrounding the plasma chamber. The magnets cause electron-cyclotron resonance for the electrons of the plasma thus creating conditions for efficient absorption of the microwave energy. The same magnets generate a magnetic field, which compresses the plasma toward the center for confining the plasma within the plasma chamber. The ion source also has an RF pumping unit that pumps into the plasma the RF energy. The RF pumping unit has a unique additional function of RF magnetron sputtering of solid targets converted into a gaseous working medium used for implantation in an ionized form. For obtaining elongated belt-type ion beams (having a width of 1 m or longer), the ion source may contain a microwave pumping system having several output windows arranged in series along the axis of the plasma chamber and on diametrically opposite sides thereof. The windows are continuously cleaned from the contaminants that might precipitate onto their surfaces. A standard-type sand blaster can be used for cleaning of the windows.

25 Claims, 6 Drawing Sheets

ELECTRON-CYCLOTRON RESONANCE TYPE ION BEAM SOURCE FOR ION IMPLANTER

CROSS-REFERENCES TO RELATED APPLICATIONS

The present patent application is a continuation of U.S. patent application Ser. No. 09/476,529 filed Jan. 3, 2000, now abandoned.

FIELD OF THE INVENTION

The present invention relates to ion-beam technology, in particular, to electron-cyclotron resonance type ion beam sources for use in ion implanters. Implanters of this kind find application for ion implantation in the manufacture of electronic devices such as LSI and VLSI semiconductor circuits.

BACKGROUND OF THE INVENTION

An ion implanter is a device, which is used for material processing in industrial manufacture. Major application of them is concentrated on semiconductor device fabrication, especially on modifying electrical properties of semiconductor materials by ion implantation, and in particular for implantation of boron and phosphorus ions into silicon. An ion source constitutes an important part of the aforementioned implanter, and its operation determines the efficiency, reliability, and performance characteristics of the implanter. The ion-beam source used in the implanter ionizes neutral molecules and accelerates the obtained ions from hundreds of eV to the required energy level of several hundred KeV. The ions are then formed into a uniform beam of a given shape and extension.

Until recently, however, the majority of ion-beam sources used in implanters for semiconductor industry were based on cumbersome, complicated, and expensive ion acceleration techniques. Examples of such technique are described, e.g., by V. V. Simonov, et al. in *"Oborudovanie Ionnoi Implantatsii"* (Ion Implantation Equipment), Moscow, "Radio I Svyaz" Publishers, 1988, pp. 35–38.

In 80's, ion-beam sources using large plasma volumes with simplified methods for the formation of ion beams, e.g., with the use of ion-plasma optics, came into use. Almost all of them consisted of two main functional units, i.e., a gas-discharge chamber for generating plasma used as an ion emitter and an ion-optical system for extracting ions from the plasma, accelerating the extracted ion, and forming a directional ion beam. The working medium used as a material for implantation was a gaseous substance supplied to the discharge chamber or a solid substance, e.g., a solid material sputterable into the plasma volume.

Since requirements of operation conditions vary from one application to another in a very wide range, it is difficult to create a universal ion source that could satisfy all these conditions at the same time. The plasma-type ion sources have found wide application in ion implanters due to high reliability and operation performance. Depending on methods of plasma generation, these ion sources can be roughly classified as high-frequency and microwave ion sources, cold-cathode type ion sources, plasma sources with hot cathodes, Penning-discharge type ion sources with hot cathodes, quasi-magnetron sources, low-pressure ion sources with arc discharge, etc. Given below is a short description of the aforementioned ion sources which find practical application.

High-frequency and microwave ion sources are based on the use of high-frequency or microwave energy for generating plasma. Of this group of ion sources, so called electron cyclotron resonance sources (hereinafter referred to as ECR sources) have found a very wide practical application. In these sources, a phenomenon of electron cyclotron resonance (ECR) is used for increasing effective concentration of electrons in plasma and thus makes it possible to generate plasma of high density. ECR is resonance of electrons in a magnetic field on a predetermined frequency, such as 2.45 GHz for the magnetic field of 0.0875 T intensity. ECR sources can be used as ion emitters with extraction of ions from both the end faces and sides of the gas-discharge chamber. Since the present invention pertains to implanters with ECR sources, they will be described later in more detail.

Cold-cathode type ion sources are sources with cold cathodes, which generate plasma in a glow discharge due to emission of electrons into a working gas from the surfaces of cathodes, resulting in ionization of the working gas molecules. The ions formed in the working gas are accelerated toward the cathode and bombard the cathode surface causing the surface to emit secondary electrons. The plasma is formed as a result of multiple repetitions of the above process. Implanters with cold-cathode ion sources are used mainly for small and ultra-small doses of implantation. Their advantage is simplicity of construction and a relatively long service life. Disadvantages are low beam currents (not exceeding 100 $\mu$A), significant fluctuations in the beam, and the limitation of using only gaseous working media.

Hot-cathode type ion sources generate an arc discharge, which is maintained by electrons emitted from the surface of a hot cathode and possessing energy exceeding the level of energy required for ionization of a gaseous working medium. Discharge occurs in a magnetic field, which is oriented parallel to the electron acceleration direction or perpendicular thereto. In the latter case the source is known as a magnetron type source. Although ion implanters utilizing such ion sources are advantageous in that they are simple in construction, are capable of generating high ion beam currents, and have a relatively stable discharge, they do not possess features required for controlling distribution of current in the resulting ion beam.

In hot-cathode ion sources with the use of a Penning discharge phenomenon for increasing concentration of electrons in plasma, extraction of ions normally occurs through a round opening in an anti-cathode (axial extraction). Ion sources of such type are known as Nilson ion sources and are used in implanters of Veeco Co. (USA) and Balzers Co. (Liechtenstein). These ion sources make it possible to utilize both gaseous and solid working media. However, with standard ion extraction energy of 30 kV, currents extracted from the Nilson-type ion sources do not exceed several hundred microamperes. Thus the implanters containing such sources inherit their disadvantages.

Quazi-magnetron ion sources, also known as Freeman ion sources, have a direct incandescence-type cathode arranged parallel to the axis of a cylindrical anode. In contrast to conventional magnetron sources, the sources of this type used for implantation have the incandescence filament offset toward the ion-emitting slit in the side surface of the cylindrical anode. Advantages of these sources, as compared to conventional hot-cathode sources, are relatively low intensity of the magnetic field (below 1 T) and weak dependence of the ion beam parameters to the parameters of discharge. The main disadvantage of quasi-magnetron ion sources is a short service life (no more than 20 hours), which is unacceptable for industrial use.

Given below is a more detailed description of ECR ion sources, which are used in ion implanters and to which the device and method of the invention pertain.

U.S. Pat. No. 5,625,195 issued to Andre Grouillet in 1997 discloses a high-energy implantation process using an ion implanter of the low-or medium-current type with an ECR ion source. In order to increase the implantation energy, this ion implanter incorporates a microwave generator with a traveling-wave tube generating an electromagnetic field with a frequency greater than or equal to 6 GHz. The initial ion source of the implanter is replaced by an electron cyclotron resonance multiply-charged ion source, including a waveguide-forming plasma cavity, whose characteristic dimension in the transverse plane of the cavity is of the same order of magnitude as the wavelength of the electromagnetic field. The microwave generator of this implanter and the plasma cavity of the multiple-charged ion source are electromagnetically coupled. A complex gaseous medium, compatible with the beam of ions desired, is admitted into the plasma cavity. The inlet flow rate of the gaseous medium is adjusted so as to maintain a residual vacuum in the plasma cavity, which is less than the pressure threshold compatible with production of multiply-charged ions. The focusing of the ion beam extracted from the plasma cavity is adjusted onto the focal point of the scanning magnet of the implanter. An ion optical system consists of three electrodes, which form an Einzel lens for adjusting the geometrical characteristics of the ion beam extracted from the cavity. This ion optics system interacts with the extraction electrode of the source, and one of the functions of this ion adjustment optics system is to focus the ion beam extracted from the cavity onto the object focal point of the scanning magnet, which allows the ion beam to pass entirely into the scanning element. More precisely, the flared extraction cone, matched to the general shape of the plasma in the plasma cavity, enables the plasma to be channeled and extracted in the form of a beam whose diameter corresponds substantially to the characteristics of the scanning magnet of the implanter. Thus an ion beam having a round cross section of a few centimeters in diameter is formed at the output of the implanter.

Various internal modifications of the high-voltage terminal have allowed this implanter, with an initial implantation energy of 200 to 250 KeV, to be converted into a high-energy implantation machine (1 MeV for $p^{4+}$ ions or even 1.5 MeV for $p^{6+}$ ions). According to the inventors of the aforementioned implanter, it has thus been possible to implant with doses of $10^{14}$ ions per $cm^2$, and this being achieved within a time compatible with production requirements (a $10^{14}$ dose obtained in two minutes for a wafer 100 mm in diameter). Finally, these operating conditions, which do not require the use of a hot filament, or moving parts, or of low pressure in the plasma chamber, considerably increase the lifetime of the source compared to that of hot-filament sources.

However, in spite of all advantages, the ion source used in the implanter of U.S. Pat. No. 5,625,195 possesses a number of disadvantages. In particular, the ion beam generated by this source, which has a round cross section of a few centimeters at the source output, has an energy of about 20–25 KeV. For further acceleration of ions to the level of energy required for implantation, the implanter that utilizes this source requires the use of an expensive and complicated ion-accelerating system, and without this system the implanter cannot develop beam energies sufficient for effective implantation. Furthermore, the ion source of U.S. Pat. No. 5,625,195 does not ensure uniformity of the ion beam current over the entire cross section of the beam extracted directly from the ECR plasma source. Another disadvantage of the known ion source is that it does not allow for adjustment of ion beam current distribution at the input to the magnetic separator and beam accelerator.

The applicants of the present patent application made an attempt to solve the problems of the prior art by developing an improved ion source for use in conjunction with an ion implanter, which is described in pending U.S. patent application Ser. No. 09/476,529 filed on Jan. 3, 2000. This patent application describes an ion source for implanting charged ions, e.g., of $B^{++}$, $P^{++}$, or the like, accelerated to the energy of a few hundred KeV. This ion source is characterized by radial direction of plasma extraction. The device is provided with a confinement space formed within a sealed vacuum chamber inside the housing of the implanter. The ions are extracted by means of a trans-axial electrostatic ion lens having a profile conforming to the boundaries of the plasma. The ion beam is then expanded by a second lens, which emits a substantially parallel ion beam of a rectangular cross-section onto the surface of the object being treated, which is moved across the ion beam. The profile of the plasma boundaries in the confinement space is determined by currents in a plurality of magnetic coils arranged in a number of horizontal layers around the plasma confinement space. If necessary, the profile of the plasma could be adjusted by measuring the ion beam current density distribution with sensors, such as Faraday cylinders, and then adjusting the currents in the aforementioned coils via a feedback mechanism.

The ion-beam source of U.S. patent application Ser. No. 09/476,529 will now be described in more detail with reference to the most essential parts and their operation. FIG. 1 is a longitudinal sectional view of the aforementioned ion beam.

The ion source, which as a whole is designated by reference numeral 20, is an ECR plasma source. ECR plasma source 20 has a housing 22 which is composed of two concentric cylindrical bodies, i.e., an outer cylindrical body 24, which is made of a non-magnetic material such as a stainless steel and is grounded at G1, and an inner cylindrical body 26, which functions as an anode, which also is made of a non-magnetic material such as a stainless steel. A positive potential, e.g., 80 kV, is applied to the inner body or anode 26 from a DC power source 28 via a conductor 30 and a high-voltage high-vacuum feedthrough 31. Such feedthroughs are standard devices, produced e.g., by Ceramsel Co., N.Y. and are intended to supply electric current to internal units of high-vacuum systems without violation of vacuum conditions. Outer cylindrical body 24 and anode 26 are interconnected by means of insulating spacers 32 and 34 to form an integral unit.

A cylindrical space 36, sufficient for placing magnetic coils described below, is formed between outer cylindrical body 24 and anode 26. Housing 22 is closed from both ends by covers 38 and 40 via sealing devices 42 and 44 so that the interior of housing 22 is sealed.

A plasma-confining magnetic system of ECR ion source 20 is defined by a plurality, e.g., four or six, of diametrically opposite paired magnets. Only two rows of such geometrically opposite magnets of these pairs, i.e., 46a, 46b, . . . 46n on one side and 48a, 48b, . . . 48n on the opposite side are shown in FIG. 1. An inner cavity 50 of anode 26 functions as a plasma-confining cavity. The plasma generated in this plasma-confining cavity is shown in FIG. 1 as a shaded area designated by reference numeral 52.

Magnets 46a, 46b, . . . 46n and 48a, 48b, . . . 48n are designed for confining plasma 52 in the inward radial direction in plasma-confining cavity 50, thus compacting it away from the inner walls of cylindrical anode 26. In order to confine the plasma in cavity 50 from end faces of this cavity, plasma source 20 is equipped with annular magnetic coils 54 and 56 arranged on opposite ends of housing 22.

Inner cavity 50 is connected to a source of vacuum (not shown) via an evacuation port (not shown) formed in lower cover 40.

As has been mentioned earlier, cylindrical space 36 is formed between outer cylindrical body 24 and anode 26. This space is necessary to install several pairs of magnetic coil arrays. Two such arrays 47 and 49 are shown in FIG. 1.

A trans-axial lens unit 58 (FIG. 1) is formed in the wall of anode 26 and projects radially outwardly from housing 22 of the ion source. Trans-axial lens unit 58 extends in the longitudinal direction of housing 22 almost along the entire length of the housing. Trans-axial lens 58 consists of three hollow electrodes 60, 62, and 64 located one inside the other with spaces 66 and 68, respectively, between the adjacent electrodes. In other words, space 66 is formed between the inner wall of electrode 60 and the outer wall of electrode 62, whereas space 68 is formed between the inner wall of electrode 62 and the outer wall of electrode 64.

Hollow electrode 60, which is the outermost electrode of the package, is supported by cylindrical anode 26 and is in electric contact therewith. As has been mentioned above, a potential of 80 kV is applied to cylindrical anode 30 from power source 32. Therefore the same potential will be applied to hollow electrode 60. A distal end of trans-axial lens 58 is open into plasma-confining cavity 50 in the form of a narrow ion-extracting slit of the same geometry as slit 68 shown in FIG. 4 of our previous patent application No. 09/476,529. This slit has a special profile described in the aforementioned patent application.

Innermost hollow electrode 64 has the same configuration as outermost electrode 60. Hollow electrode 64 is grounded. Electrode 64 has an ion extraction slit on its distal end and an ion outlet opening 70 on the outer or proximal end. The construction of the electrodes 60, 62, 64 and their slits are the same as in our previous patent application.

Located between outermost electrode 60 and innermost electrode 64, is intermediate hollow electrode 62. A negative potential, e.g., −3 to −5 kV, is applied to intermediate electrode 62 from a negative terminal of an electric power source (not shown). Intermediate electrode 62 is electrically insulated from innermost electrode 64 and outermost electrode 60.

Reference numeral 72 designates a second ion optical lens, which may be installed inside a hollow ion-beam guide 74 which extends further in the direction of propagation of the ion beam extracted from the plasma source 20. Similar to trans-axial ion lens 58, lens 72 is formed by hollow electrodes; in this case by two hollow electrodes 76 and 78 located one inside the other with a space 80 between them. This ion beam lens has a convex profile on the side facing trans-axial lens 58. Electrodes 76 and 78 have slits (not shown), which are aligned with each other and with the slits of trans-axial lens 58.

Thus, trans-axial lens 60 and ion beam lens 72 in combination form a telescopic ion beam system which may form an ion beam of a rectangular cross-section or a strip-like substantially parallel ion beam, i.e., an ion beam with very small angles of divergence in mutually perpendicular planes, i.e., in the plane of FIG. 1 and in the plane perpendicular thereto.

In FIG. 1, reference numeral 82 designates a waveguide for transmitting microwave energy with the frequency, e.g., of 2.45 GHz, required for creating so-called electron-cyclotron resonance (ECR) conditions described in our previous patent application. Waveguide 82 comprises a hollow metallic tube 84 of a rectangular cross-section made of a highly conductive material, e.g., silver-coated copper. Tube 84 is connected to cylindrical anode 26 and is electrically isolated therefrom by means of a sealing device 86. An outlet opening 88 of tube 84 into plasma-confining cavity 50 is closed by a heat-resistant window 90 transparent to microwave energy. An example of such a material is quartz. The interior of outer cylindrical body 24, i.e., plasma-confining cavity 50, as well as space 36, and the entire inner cavity 50 of ion-beam source 20 are sealed from the environment surrounding ion-beam source 20.

A working medium, e.g., a boron-containing gas such as $BCl_3$, $BF_3$, or a phosphorus-containing gas such as $PH_3$, etc., is supplied into interior cylindrical anode 26 via a tube 92 which passes into this interior through a standard high-vacuum, high-voltage resistant feedthrough device 94. Such a feedthrough device is produced, e.g., by Insulator Seal Incorporated, Hayward, Calif., USA.

In order to enhance the energy of plasma, ion-beam source 20 is equipped with at least one antenna for supplying a radio-frequency (RF) power into the plasma 52. In the embodiment, illustrated in FIG. 1, this device has two such antennas 96 and 98, which can be inserted into plasma-confining cavity 50, e.g., through magnets 54 and 56, although the antennas can be inserted through any other locations. It is understood that antennas 96 and 98 should be inserted into cavity 50 without violation of vacuum conditions, i.e., through appropriate high-vacuum, high-voltage resistant feedthrough devices 100 and 102 of the same type as those mentioned above. Terminals 104 and 106 located on outer ends of antennas 96 and 98 are connected to appropriate microwave sources (not shown), e.g., of 13.72 MHz frequency.

Operation of ion source 20 will be further described with reference to aforementioned FIG. 1. Plasma-confining cavity 50 of ion source 20 is evacuated via the evacuation port by means of a vacuum pump (not shown). Microwave energy of 2.45 GHz is pumped into cavity 50 inside hollow anode 26 (a MW generator is not shown). When vacuum reaches a predetermined level, e.g., of 0.5 mTorr, a working medium, e.g., a boron-containing gas, is supplied via gas supply tube 92 into cavity 50. The plasma-confining magnetic system formed by the magnet arrays 46, 48, etc., generates plasma magnetizing and confining magnetic fields inside cavity 50.

In some areas of cavity 50, magnet arrays 46, 48, etc. generate magnetic fields within a strength of 0.0875 Tesla, which is a resonance field for 2.45 GHz frequency oscillation of electrons. As a result, these electrons begin to intensively consume the microwave energy. This phenomenon, which is known as an electron cyclotron resonance (ECR), enhances plasma and allows the development of plasma charge densities of up to $10^{13}$ e/cm$^3$. In other words, a very dense plasma 52 is developed in the cavity 50. Plasma 52 is further intensified by radio frequency supplied into cavity 50 via antennas 96 and 98.

For effective extraction of plasma 52 from plasma-confining cavity 50, it is necessary that the outer plasma boundary conform to the profile of the trans-axial lens 60 on its distal end, where plasma-extracting slits are formed. This is achieved by means of the aforementioned arrays 47 and 49 of magnetic coils. Since the coils of these arrays have their own individual power sources (not shown), the magnetic fields developed by these coils can be individually adjusted to ensure fine conformity of the plasma boundary to the lens profile. After such conformity is achieved, positive boron ions are extracted from plasma 52 via the plasma emitting slits of trans-axial lens 60. Due to the fact that the boron ions are double-charged ($B^{++}$) and that above-described potential difference between three outermost hollow electrodes 60 and innermost hollow electrode 64 of trans-axial lens 60 is about 85 kV, boron ions may develop in the interelectrode magnetic fields energies of about 170 KeV. An ion beam IB formed on the output of trans-axial lens unit 58 is diverged (FIG. 1), and when it passes through ion lens 72, its angle of divergence is reduced, so that an almost parallel ion beam of a rectangular cross section exits ion-beam guide 74 and enters a working vacuum chamber (not shown).

In spite of the advantages inherent in the ion-beam source of U.S. patent application Ser. No. 09/476,529 filed on Jan. 3, 2000, it still possesses some drawbacks. In particular, the aforementioned ion-beam sources can produce ions only from gaseous working materials. In other words, material to be implanted is supplied to the plasma chamber only in a gaseous phase. Furthermore, when the aforementioned source generates a belt-like ion beam of a rectangular cross section, which is to be delivered to the treated object through the output of the implanter, the longer dimension of the aforementioned rectangular cross section, which hereinafter will be referred to as a width of the ion beam, is limited substantially to the length of the microwave pumping waveguide. For microwave energy pumping, e.g., of 2.45 GHz, such a waveguide cannot have an ion beam width exceeding 15–20 cm, even with waveguide output cross-section modified for obtaining the maximum dimension. This, in turn, limits efficiency of the source.

As mentioned above, the interior of vacuum chamber 50 of ion source 20, which normally operates under conditions of deep vacuum at about $10^{-8}$ Torr or lower is sealed from the microwave pumping system by quartz or ceramic windows 90 transparent to microwave energy. During operation of ion source 20, these windows are contaminated by plasma particles from the side of plasma chamber 50. Contamination of the windows may reach such a level that further use of the source becomes impossible because of non-transparency of windows 90, which in this case do not pass microwave energy to cavity 50. This violates plasma-sustaining conditions. Therefore, when the windows are contaminated, the entire system has to be stopped, the source has to be disassembled and the windows have to be cleaned or replaced. This disadvantage is reflected in increased costs of production and maintenance.

Another specific disadvantage inherent in the ECR ion source described in the aforementioned U.S. patent application Ser. No. 09/476,529 consists in that radial extraction of ions is carried out with the use of a trans-axial three-electrode ion lens. Although the aforementioned trans-axial three-electrode ion lens is advantageous in that it provides an extremely high uniformity of distribution of ions in the narrow beam produced by this lens, the drawback of this lens is the use of three electrodes. This is because these electrodes work under conditions of significant potential difference with respect to each other. Such a mode results in high current losses which lead to decrease in the efficiency of the ion source as a whole.

OBJECTS OF THE INVENTION

It is an object of the invention to provide an ion-beam source for use in an ion implanter which is suitable for operation with gaseous as well as with solid materials for generation of ions. Another object is to provide an ion-beam source of the aforementioned type having an increased width of the ion beam, which may exceed 20 cm. Still another object is to provide an ion-beam source for use in an ion implanter with a mechanism for periodic or continuous cleaning of waveguide output windows. Further object is to provide an ion-beam source for an ion implanter, which is simple in construction because it is free of a trans-axial three-electrode lens, reliable and efficient in operation, and inexpensive to manufacture. Still another object is to provide a method for generation of ions from gaseous and solid materials in efficient way and in the form of wide ion beams.

SUMMARY OF THE INVENTION

An ECR ion-beam source of the invention for use in an ion implanter has a sealed plasma chamber in which plasma is excited by microwave radiation of 2.45 GHz in combination with an external magnetic field generated by permanent magnets surrounding the plasma chamber. The magnets cause electron-cyclotron resonance of electrons in the plasma thus creating conditions for efficient absorption of the microwave energy. The same magnets generate a magnetic field, which compresses the plasma toward the center for confining the plasma within the plasma chamber. The ion source also has an RF pumping unit that pumps RF energy into the plasma. The RF pumping unit has a unique additional function of RF magnetron sputtering of solid targets converted into a gaseous working medium used for implantation in an ionized form. For obtaining elongated belt-type ion beams (having a width of 1 m or longer), the ion source may contain a microwave pumping system having several output windows arranged in series along the axis of the plasma chamber and on diametrically opposite sides thereof. These windows seal the plasma chamber, which is under conditions of deep vacuum, from the surrounding environment but are transparent for microwave radiation. As the windows are subject to contamination, especially in the case of using magnetron solid target sputtering, the ion source is provided with a special mechanism for restoration of transparency of windows.

DETAILED DESCRIPTION OF THE INVENTION

Figure 1:
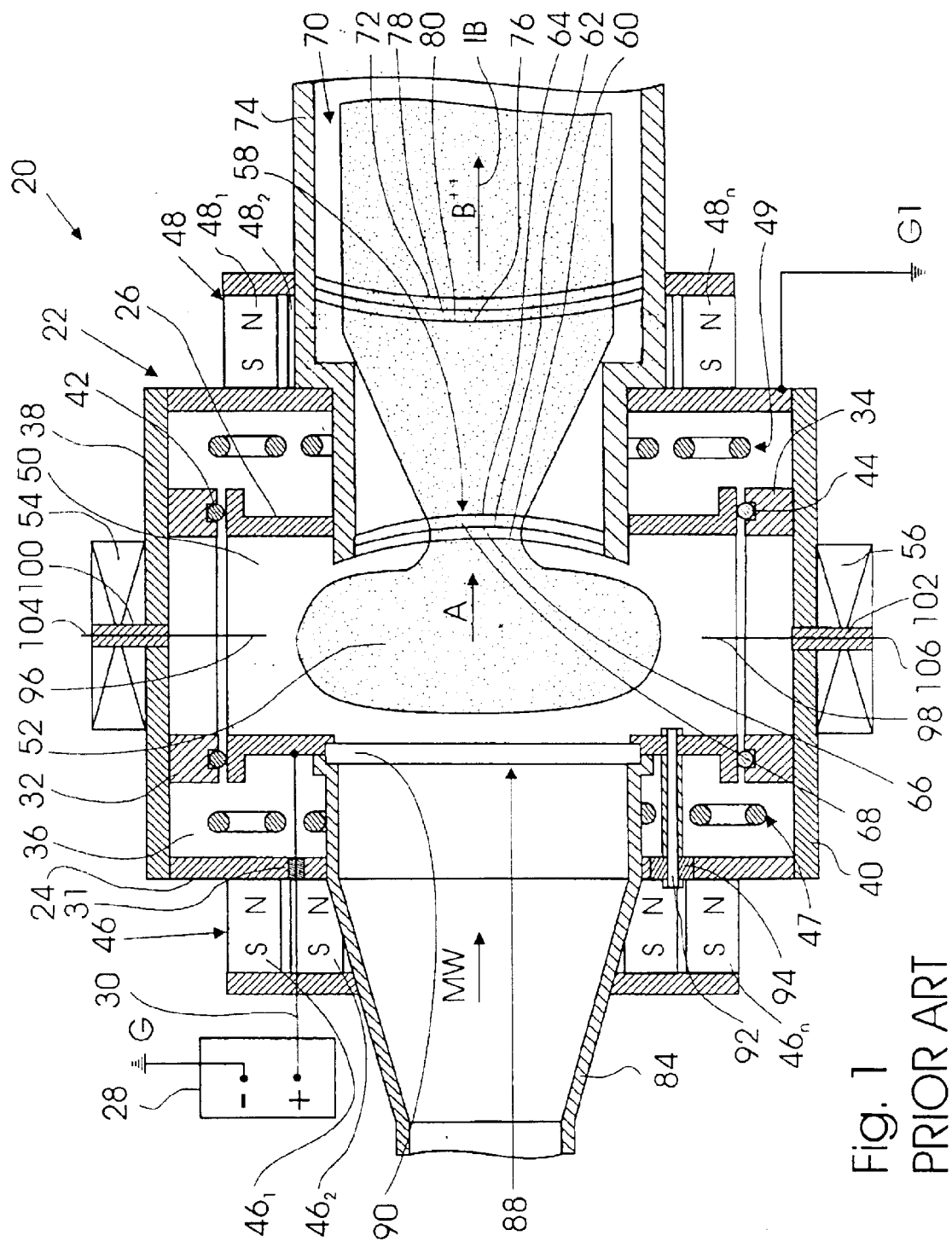
FIG. 1 is a longitudinal sectional view of a known an ion-beam source for use in an ion implanter.
Figure 2:
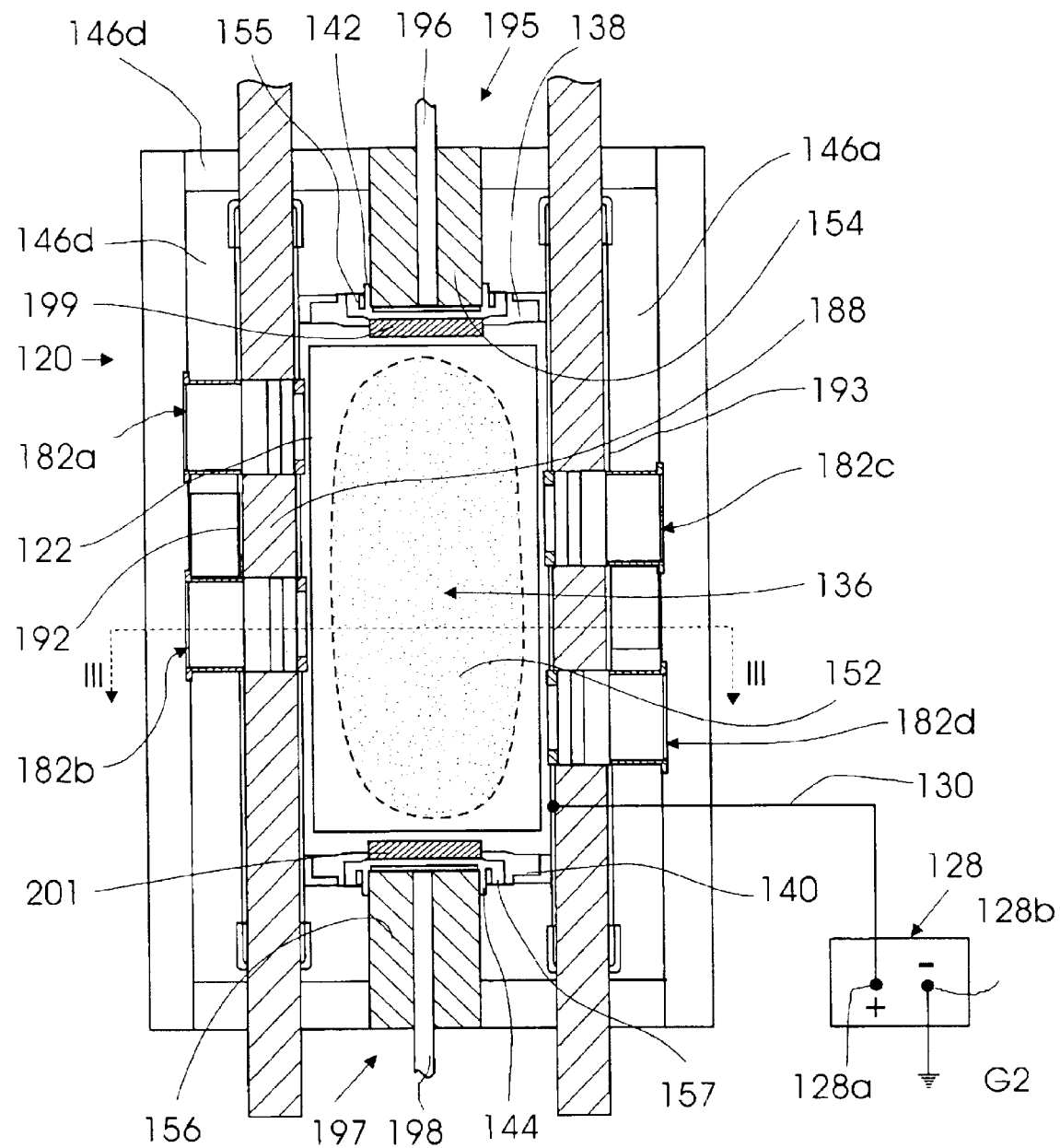
FIG. 2 is a longitudinal section of an ion-beam source of the present invention.

The ion-beam source of the invention, which is shown in a longitudinal sectional view in FIG. 2, is in some part similar to ion-beam source 20 of my previous patent application shown in FIG. 1.

Since ion-beam source 20 of the previous patent application has been described in detail, some parts and units of the present ion source of FIG. 2 identical to those shown in FIG. 1 will be omitted from the description. Furthermore, parts of the ion source of the invention similar to those of the previous patent application will be designated where appropriate by the same reference numerals but with an addition of 100.

The ion source of the invention, which as a whole is designated by reference numeral 120, is an ECR plasma source. ECR plasma source 120 has a housing 122, which is made of a non-magnetic material such as a stainless steel and is connected to a positive terminal 128a of a DC power source 128. The negative terminal 128b of the DC power source 128 is grounded at G2. The positive terminal 128a applies to the housing or anode 122 a positive potential, e.g., 80 kV. Housing or anode 122 has an elongated tubular shape and is closed from both ends by covers 138 and 140 via sealing devices 142 and 144 so that the interior of housing 136 is sealed.

Figure 3:
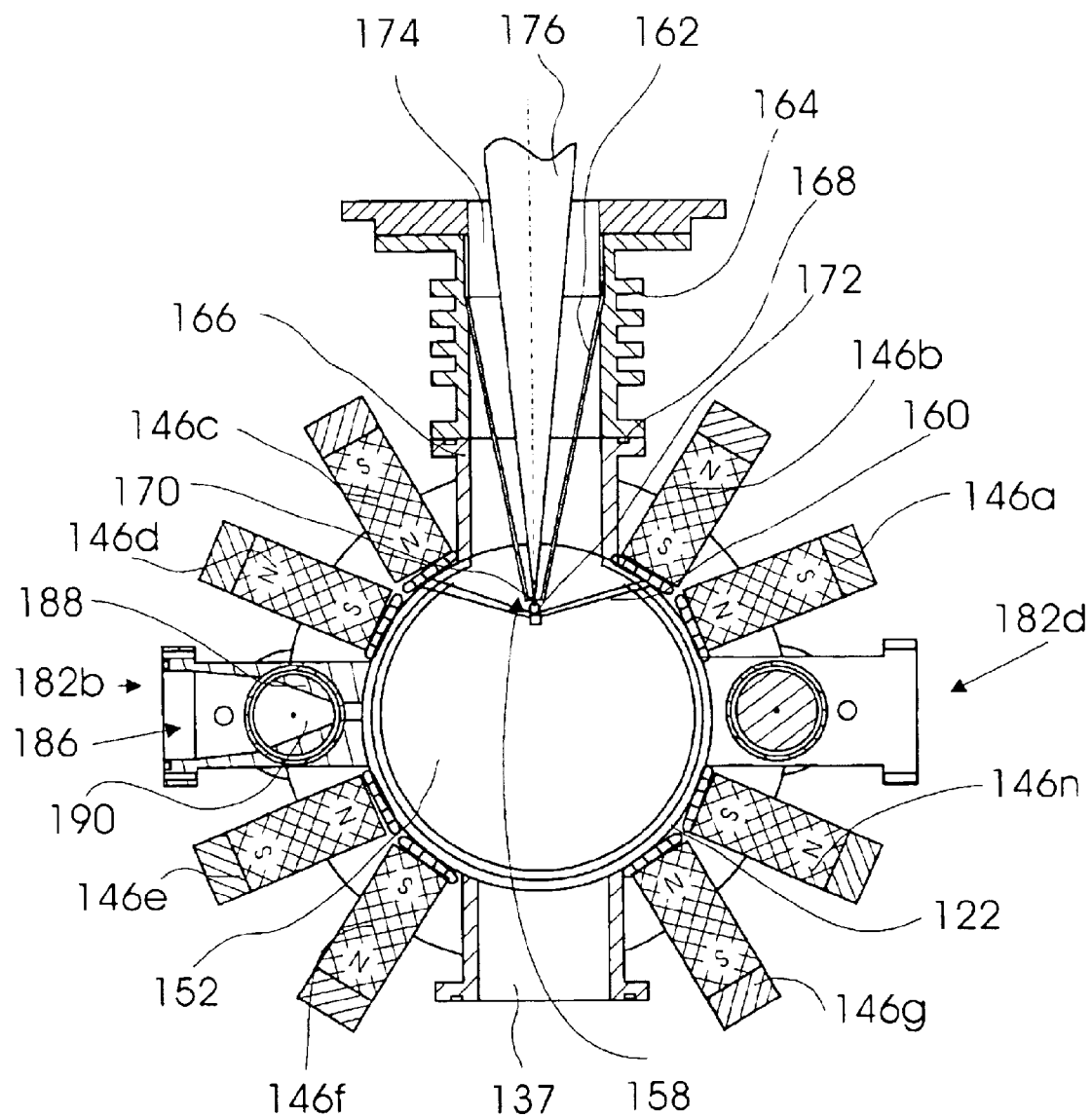
FIG. 3 is a cross-sectional view along the line III—III of FIG. 2.

As shown in FIG. 3, which is a sectional view of FIG. 2 along line III—III, a plasma-confining magnetic system of the ECR ion source 120 is defined by a plurality of circumferentially arranged pairs of magnets 146a–146b, 146c–146d, 146e–146f, and 146g–146h (FIG. 3). Two adjacent poles of each pair of magnets have different polarity. For example, the pole of the magnet 146a nearest to the anode 122 is negative, and the pole of the magnet 146b nearest to the anode 122 is positive, etc. As shown in FIG. 2, the magnets 146a . . . 146h extend along the entire length of the anode or housing 122. Although four pairs of such magnets are shown in FIG. 3, it is understood that the number magnet pairs may be different.

An inner cavity 136 of anode 122 functions as a plasma-confining cavity. The plasma generated in this plasma-confining cavity is shown in FIG. 2 as a shaded area designated by reference numeral 152.

Magnets 146a–146h designed for confining plasma 152 in the inward radial direction in plasma-confining cavity 136 for compacting it away from the inner walls of cylindrical anode 122. In order to confine the plasma in cavity 136 from end faces of this cavity, plasma source 120 is equipped with permanent magnets 154 and 156 arranged on opposite ends of housing 122. The permanent magnets 154 and 156 are insolated from the covers 138 and 140 by respective ceramic caps 155 and 157.

Inner cavity 136 connected to a source of vacuum (not shown) via an evacuation port 137 shown in FIG. 3.

Extraction of ions from the plasma 152 contained in the plasma-confining cavity 136 is carried out with the use of a two-electrode lateral ion-extraction lens 158 which is formed in the wall of anode 122 and projects radially outwardly from housing or anode 122 of ion source 120. The lens 152 extends in the longitudinal direction of housing 122 along almost the entire length of the housing. As shown in FIG. 3, which is a cross-sectional view along the line III—III of FIG. 2, two-electrode lateral ion-extraction lens 158 consists of two hollow electrodes 160 and 162. The outer electrode 160 is formed as a tapering recess of the housing 122 directed inwardly and having a large angle of taper (an obtuse angle), and the inner electrode 162 is formed as a tubular tapering body with a small taper angle and with the tip of the electrode 162 inserted into the recess formed by the electrode 160. As has been mentioned above, the anode 122 and, hence, the outer electrode 160 are maintained under the high-voltage potential, while inner electrode 162 is maintained under the ground potential. The outer end of the inner electrode 162 extends in the radial outward direction from the ion source 122 in the form of a tunnel having a rectangular cross-section and is intended for delivery of the ion beam to the destination.

Reference numeral 164 in FIG. 3 designates a ceramic isolation unit use for attaching the inner electrode 162 to the outer surface of the housing 122 via a flanged part 166 of the housing. Thy connection is sealed by a seal ring 168.

A inner end of the inner electrode 162 has a longitudinal slit 170, which faces the longitudinal slit 172 formed in the innermost area of the outer electrode 160. Thus, the two-electrode lens connects the plasma-confined space 136 with the ion-beam guide 174 formed by the extension of the inner electrode 160. It is understood that the narrow ion-extracting slits 170 and 172 (FIGS. 2 and 3) extends in the axial direction of the housing or anode 122 along the entire plasma column 152 generated inside the plasma-confining cavity 136. In a real construction, the extracted ion beam 176 may have a width of 1 m or greater, which could not be attained in a high-energy type ion-beam source of any known construction.

For obtaining the aforementioned elongated belt-type ion beams (having a width 1 m or longer), ion source 120 may contain a microwave-energy (ME) pumping system (FIGS. 2) having several output windows arranged in series along the axis of the plasma chamber and on diametrically opposite sides thereof. The ME pumping system is intended for transmitting to plasma cavity 136 microwave energy with the frequency, e.g., of 2.45 GHz, required for creating so-called electron-cyclotron resonance (ECR) conditions described in our previous patent application. The ME waveguide system comprises several (four in FIG. 2) ME pumping units 182a, 182b, 182c, and 182d.

Since all these units are identical, only one of them, e.g., the ME pumping unit 182b, is described. The unit comprises a hollow metallic waveguide 184 of a rectangular cross section made of a highly conductive material, e.g., silver-coated copper. The waveguide 184 is electrically and mechanically connected to cylindrical anode 122 (FIG. 3).

ME pumping units 182a, 182b, 182c, and 182d are arranged on opposite sides of plasma-confining cavity 136 in an alternating order and, as shown in FIG. 2, are shifted in a cavity axial direction for a pitch P equal to a distance between two maximums of amplitudes in the alternating magnetic field of a cylindrical resonator for the case of low-order modes with a toroidal magnetic field. In other words, each ME pumping unit in principle generates conditions of a single pumping unit of the previous patent application, but in order to provide uniformity of plasma over the width of the plasma beam 176, the alternating ME units located on the opposite sides of cavity 136 have to be shifted with respect to each other in a manner described above.

The inner surface of the waveguide 184 has a shape tapering in the radial inward direction, i.e., toward the anode 122 and is open into the plasma-confining cavity in the form of ME pumping windows. As shown in FIG. 3, the waveguide 184 (as well as the three other waveguides) has a ME pumping windows 186 formed by a metal rod 188 with a through longitudinal slit 190. The rod 188 is stationary with respect to the ion source 122 and is inserted with a sliding fit into a protective rotating tube 192 made of a material transparent to a microwave energy, e.g., of quartz or ceramic. The rotation mechanism for tube 192 will be described later. It is understood that all four ME pumping units 182a, 182b, 182c, and 182d are identical. The tubes 192 and 193 (FIG. 2) extends through the entire axial length of the ion-beam source 122 and even further beyond the boundary of the housing 122 for connection to the tube rotation mechanism shown in FIG. 4. The tubes 192 and 193 are intended for sealing the plasma-confining space 136, which is under high vacuum of about $10^{-8}$ Torr, from the outer space, as well as for passing the microwave energy from the ME pumping units 182a, 182b, 182c, and 182d to the plasma-confining space 136.

The ion source 120 of the present invention is also provided with an RF pumping system for pumping 13.7 MHz RF energy into plasma-confining cavity 136. In the embodiment of the ion source 120 shown in FIG. 2, this pumping system is presented in the form of two RF pumping units 195 and 197 installed in covers 138 and 140 of the housing of ion source 120. Each of these units fulfills two functions, i.e., it enhances the energy of plasma 152 and at the same time serves as a source of a solid sputterable material turned by magnetron sputtering into a gaseous form and used for the formation of an ion beam and hence for the implantation.

Since both RF pumping units are identical, only one of them, e.g., unit 195, will be described in detail. Unit 195 consists essentially of two parts, i.e., an RF antenna-feeder 196, which receives an RF energy from an RF source and matching unit (not shown), e.g., of 13.72 MHz frequency, for transmission into plasma 152, and a magnetron sputtering target 199. The second magnetron target is designated by reference numeral 201 (FIGS. 2 and 3). The aforementioned permanent magnets 154 and 156 serve as sources of a magnetic field for the magnetron-sputtering effect of the targets 199 and 201, respectively. The targets may comprise any material which has to be implanted into the object of implantation and which cannot be delivered in a gaseous form. Such materials can be represented, e.g., by boron-containing materials which can be sputtered due to interaction with plasma 152 and delivered in the form of ions into the ion beam 176 generated by ion source 120.

Figure 4:
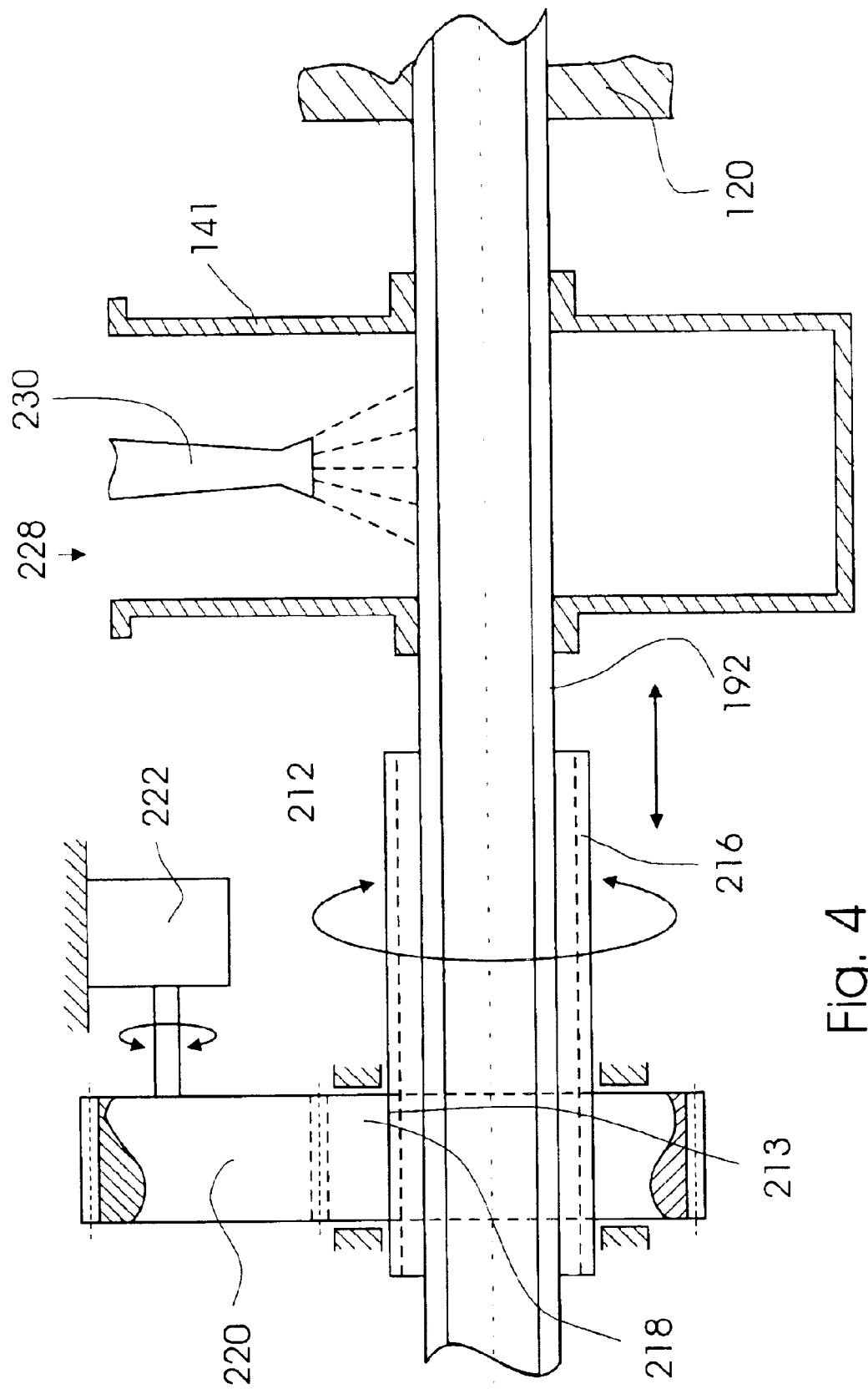
FIG. 4 is a schematic view of a window cleaning mechanism.

As tubes 192 and 193 are subject to contamination, especially in the case of using magnetron solid target sputtering, the ion source 120 is provided with a special mechanism for restoration of transparency of windows. This mechanism, which is shown in FIG. 4 for tube 192 and is identical to the mechanism for cleaning the tube 193, is designated as a whole by reference numeral 210. The mechanism 210 consists of a elongated nut 212 which is pressed onto the outer surface of the ceramic or quartz tube 192 or connected to the tube 192 an via adhesive layer 214. The outer thread 216 of the nut 212 engages the inner thread 213 formed in the opening of a gear wheel 218, which is in mesh with another gear 220. The gear 220 is rotated by a reversing motor 222, so that rotation of the motor 222 causes, via the gear 220, gear 218, and the threaded connection between the nut 212 and the inner thread 213 in the opening of the gear 218, rotation and axial reciprocation of the tube 192.

For cleaning the contaminated surfaces of the tube 192, the cleaning mechanism 210 is equipped with a sand-blast apparatus 228, the nozzle 230 of which is positioned near the exit of the tube 192 from ion source 120. It is understood that the nozzle is located in a confined space shown by a casing 141, which protects the outer surfaces of the ion source from contamination with the products of sand-blasting and contaminants removed from the rods.

Figure 5:
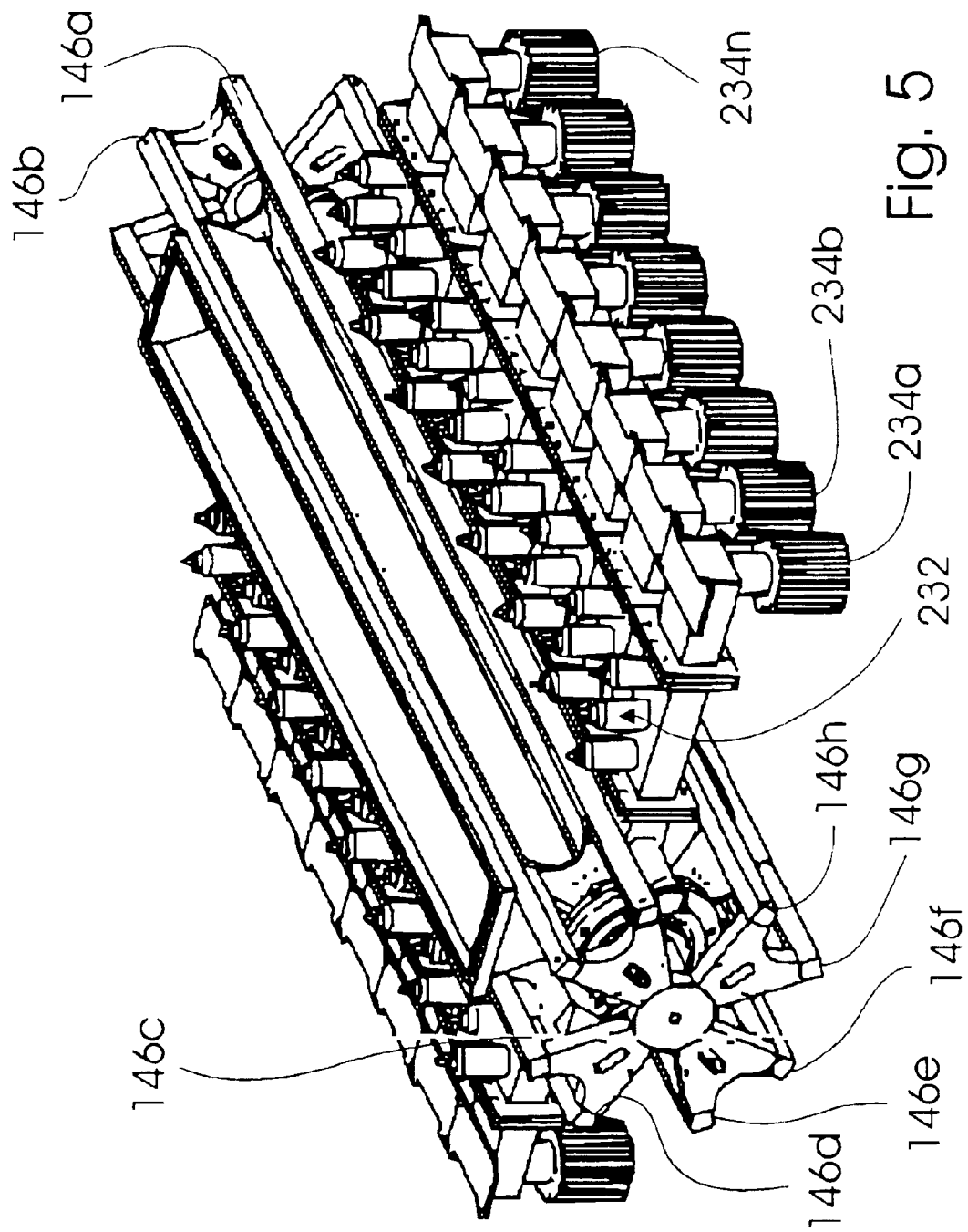
FIG. 5 is a three-dimensional external general view of the ion-beam source of the invention.
Figure 6:
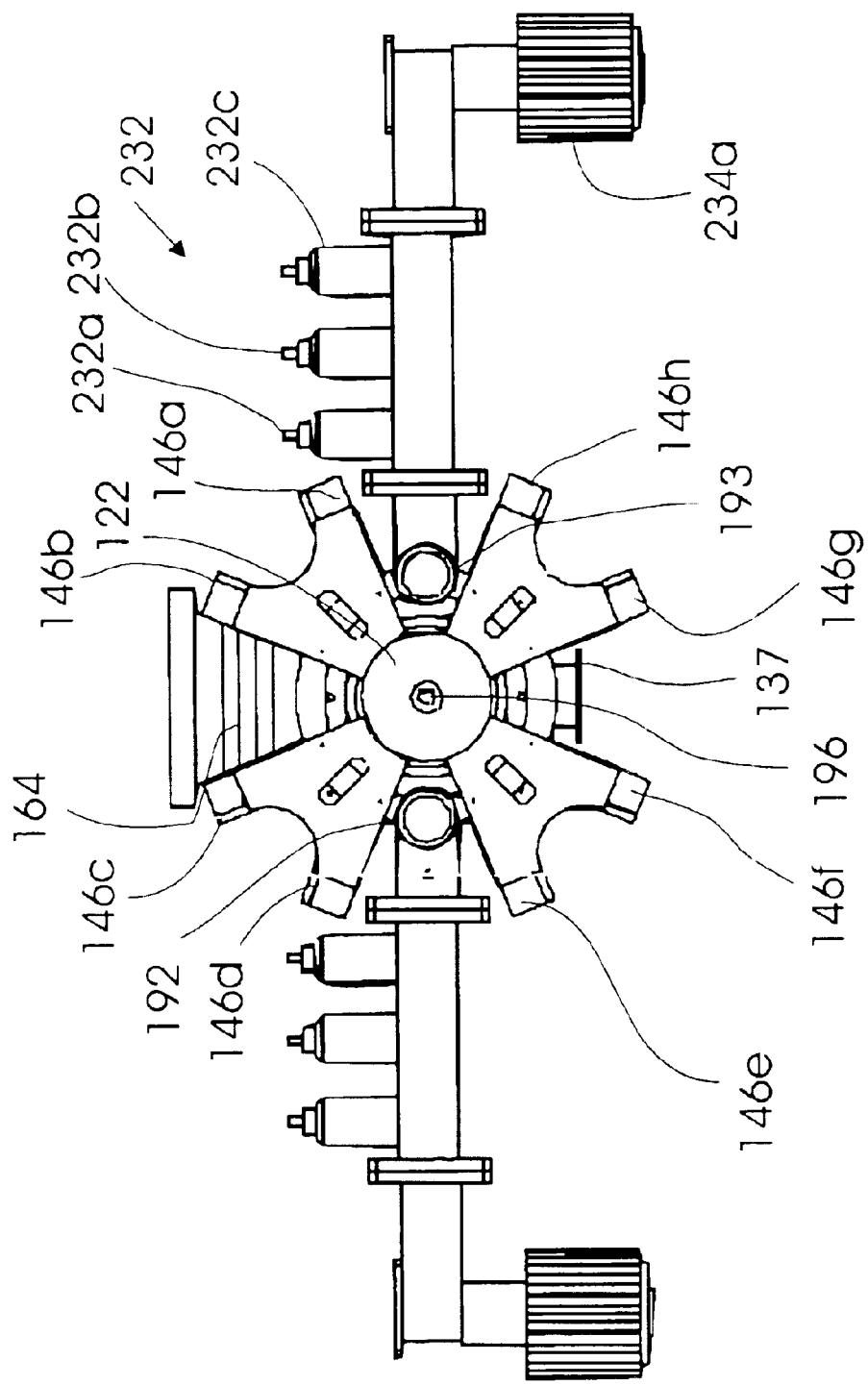
FIG. 6 is an end view of the ion-beam source of FIG. 5 in the direction of arrow C.

For convenience of explanation and designation of multiple parts and units of the ion source of the invention, the ion source 120 is shown in FIGS. 2 and 3 in an exaggerated form without proper proportions between the parts and units. FIGS. 5 and 6 show the ion source of the invention 120 in a form close to real construction. In particular, FIG. 5 is a three-dimensional external general view of the ion-beam source 120, and FIG. 6 is an end view of the ion-beam source of FIG. 5 in the direction of arrow C of FIG. 5. The main externally seen parts of the ion source 120 shown in FIGS. 5 and 6 are designated by the same positions as in FIGS. 2 and 3. In FIG. 5, reference numerals 146a–146b, 146c–146d, 146e–146f, and 146g–146h designate pairs of permanent magnets shown in FIG. 3. Reference numerals 234a, 234b, . . . 234n designate magnetron-type ME generators. FIG. 6 shows a matching device 232 with matching elements 232a, 232b, and 232c intended for matching the respective magnetron ME generators with the plasma-plasma confining space 236.

The ion-beam source 120 of the present invention operates as follows:

Plasma-confining space 136 of ion source 120 is evacuated via the evacuation port 137 by means of a vacuum pump (not shown). Microwave energy of 2.45 GHz is pumped into space 136 inside hollow anode 122 (a ME generators 234a, 236b . . . are shown in FIGS. 5 and 6). When vacuum reaches a predetermined level, e.g., of 0.5 mTorr, a carrier gas, such as argon, is supplied via the gas supply tube (not shown) into the space 136. The plasma-confining magnetic system formed by magnet arrays 146a–146h and the magnets 154, 156 generates plasma magnetizing and confining magnetic fields inside the space 136.

In some areas of 136, magnet arrays 146a–146h generate magnetic fields with a strength of 0.0875 Tesla, which is a resonance field for 2.45 GHz frequency oscillation of electrons. As a result, these electrons begin to intensively consume the microwave energy. This phenomenon, which is known as an electron cyclotron resonance (ECR), enhances plasma and allows for the developing of plasma charge densities of up to $10^{13}$ e/cm$^3$. In other words, a very dense plasma 152 is developed in the plasma-confining space 136. The aforementioned 2.45 GHz microwave energy is generated by magnetron sources 134a–134n (FIGS. 5 and 6) and is supplied to the space 136 via ME waveguide system of several (four in FIG. 2) ME pumping units 182a, 182b, 182c, and 182d and via the windows (such as the window 186 shown in FIG. 3). Plasma 152 is further intensified by radio frequency supplied into the space 136 via antennas-feeders 196 and 198.

For effective extraction of plasma 152 from plasma-confining space 136, it is necessary that the outer plasma boundary conform to the profile of the two-electrode lens 158 in the area of plasma-extracting slits 170 and 172. This is achieved by individual adjustments of the magnetron ME pumping generators 234a–234n. The RF pumping source is energized for supplying the RF energy via antennas-feeders 196 and 198 to plasma 152 and for feeding the RF energy to magnetron targets 199 and 201. When pressure of argon in the space 136 reaches a predetermined level, and RF power is supplied to the magnetron targets 199 and 201, a process of RF magnetron sputtering is initiated. This process is known and is described in detail, e.g., in book "Glow Discharge Processes" by Brian Chaspman, John Willey & Sons Publishers, N.Y., 1980. Since this process is beyond the scope of this invention, its detailed description is omitted. It should be noted, however, that in the system of the invention, a part of RF energy supplied to magnetron targets 199 and 201 enters the plasma 152 and increases plasma density. Furthermore, the plasma 152 is maintained under a potential close to the potential of anode 122, e.g., about 80 kV. The effect of magnetron sputtering is possible when the potential on magnetron targets 199 and 201 is close to that of the plasma. This condition can be achieved, e.g., by applying the anode potential also to the magnetron targets 199 and 201. For sputtering under these conditions, it is required that the constant potential of antennas-feeders 199 and 201 be of a floating nature, i.e., could accept the constant component of the target potential. This is achieved by isolating the RF power supply source to withstand 80 KV and by connecting it to the power supply circuit via a special 80 KV high-voltage dividing transformer (not shown).

The material of the magnetron targets 199 and 201 is sputtered, and the sputtered molecules enter the plasma-confining space 136, where they are uniformly distributed over the plasma 152. In the plasma 152, the molecules of the target material are ionized due to collisions with electrons and ions of the carrier gas. These ions are extracted from ion-beam source 120 via ion extracting slit 170 and 172 (FIGS. 2 and 3).

The process of RF magnetron sputtering was chosen for the ion-beam source of the present invention since this process allows sputtering of conductive as well as non-conductive materials and easily transfers these materials into a gaseous plasma state.

During operation of ion source 120, the products of sputtering contaminate the quartz or ceramic tubes 192 and 193 of the windows for ME pumping. Therefore the tubes 192 and 193 are constantly cleaned by the cleaning mechanism shown in FIG. 4. More specifically, the gear 220 is rotated by a reversing motor 222, so that rotation of the motor 222 causes, via the gear 220, gear 218, and the threaded connection between the nut 212 and the inner thread 213 in the opening of the gear 218, rotation and axial reciprocation of the tube 192. During rotation and axial movement each tube passes by the nozzle 230 (FIG. 4) of a sand blast apparatus.

Although the invention has been described with reference to specific embodiments and drawings, it is understood that these embodiments are shown only as examples and that many changes and modifications are possible within the scope of the attached patent claims. For example, the antennas-feeders are shown passing through the covers. However, they can be inserted through any other locations, provided they are inserted into space 136 without violation of vacuum conditions, i.e., through appropriate high-vacuum, high-voltage resistant feedthrough devices. Although two rows of windows and ME pumping units arranged in diametrically opposite directions have been shown and described in connection with the invention, it is understood that three or more axial rows of ME pumping windows with three or more windows closed by three or more quartz rods uniformly angularly spaced can be used. The invention has been described in reference to magnetron sputtering of the target material in combination with RF pumping. However, the functions of magnetron sputtering and RF pumping can be separated. Moreover, these two processes can be performed simultaneously on different RF frequencies with the use of individual RF pumping sources, e.g., of 13.7 MHz on one of them and 80 MHz on the other or vice verse. The rod cleaning mechanism and the sand blast system can be installed above the cover 138 on the opposite side of the ion-beam source housing. The ion source of the invention can be used as the ion source of the previous patent application, i.e., with the extraction of ions directly from the gaseous working medium, i.e., without the supply of solid sputterable materials. Cleaning of the rods can be carried out by means other than sand blasting, e.g., by chemical treatment.

What is claimed is:

1. An electron cyclotron resonance type ion source comprising: a hollow housing, which functions as an anode and is maintained under high voltage, said housing being made of a non-magnetic material; a source of electric power having a negative terminal and a positive terminal, said positive terminal being connected to hollow housing for applying said high voltage, said negative terminal of said source of electric power being grounded, the interior of said sealed hollow housing forming a plasma-confining cavity having an axial length; permanent magnetic field generation means for generating a permanent magnet field within said plasma-confining cavity for confining a plasma, formed in said plasma-confining cavity, in a radial inward direction; microwave energy generation means with a frequency satisfying a condition of electron-cyclotron resonance consumption of microwave energy by said plasma, said microwave energy generation means comprising at least two individual microwave generators and at least two microwave energy pumping units, respectively, for supplying microwave energy into said plasma-confining cavity, said microwave energy having a frequency required for said condition of electron-cyclotron resonance consumption for electrons of said plasma; at least one window extending in the direction of said axial length, said window being transparent to said microwave energy of said microwave energy pumping units for passing said microwave energy to said plasma-confining cavity, said at least one window having means for sealing said plasma-confining cavity; RF energy supply means for supplying RF energy to said plasma-confining cavity; means for the supply of a gaseous medium into said sealed hollow housing; ion-beam formation and extraction means for forming an ion beam and extracting said ion beam from said plasma; and means for cleaning said at least one window from contamination.

2. The ion-beam source of claim 1, wherein said at least one window comprises a metal rod of a round cross section having a through window extending in a direction of said axial length, and means for scaling said plasma-confining cavity comprises a reciprocating and rotating tubular body which is transparent to said microwave energy and into which said metal rod is slidingly inserted.

3. The ion-beam source of claim 1, wherein said means for cleaning comprises a mechanism for rotating said tubular body and reciprocating thereof in said direction of said axial length, and means for removing contaminants from the surface of said tubular body.

4. The ion-beam source of claim 3, wherein said means for removing contaminants comprise a sand-blast mechanism.

5. The ion-beam source claim 2, wherein said gaseous medium is a carrier gas and molecules of a target material sputtered by an RF magnetron.

6. The ion-beam source of claim 2, further comprising: means for cleaning said at least one window from contamination; and at least one RF sputtering magnetron connected to said RF energy supply means, said gaseous medium comprising a neutral gas.

7. The ion-beam source of claim 6, wherein said at least one window comprises a metal rod of a round cross section having a through window extending in said direction of said axial length, and means for sealing said plasma-confining cavity comprises a reciprocating and rotating tubular body which is transparent to said microwave energy and into which said metal rod is slidingly inserted.

8. The ion-beam source of claim 7, wherein said means for cleaning comprises a mechanism for rotating said tubular body and reciprocating thereof in said direction of said axial length, and means for removing contaminants from the surface of said tubular body.

9. The ion-beam source of claim 7, wherein said means for removing contaminants comprise a sand-blast mechanism.

10. The ion-beam source of claim 6, wherein said at least one RF sputtering magnetron comprises a magnetic field generation means and a magnetron sputtering target made from a sputterable material supplied to said gaseous medium.

11. The ion-beam source of claim 2, further comprising: means for cleaning said at least one window from contamination; and at least one RF sputtering magnetron connected to said RF energy supply means; said at least two individual microwave generators comprising a plurality of individual microwave generators arranged sequentially in alternating order on opposite sides of said hollow housing with shift in said direction of said axial length, said at least two microwave energy pumping units comprising a plurality of microwave energy pumping; said gaseous medium comprising a neutral gas.

12. The ion-beam source of claim 11, wherein said at least one window comprises a metal rod of a round cross section having a through window extending in said direction of said axial length, and means for sealing said plasma-confining cavity comprises a reciprocating and rotating tubular body which is transparent to said microwave energy and into which said metal rod is slidingly inserted.

13. The ion-beam source of claim 12, wherein said means for cleaning comprises a mechanism for rotating said tubular body and reciprocating thereof in said direction of said axial length, and means for removing contaminants from the surface of said tubular body.

14. The ion-beam source of claim 13, wherein said means for removing contaminants comprise a sand-blast mechanism.

15. The ion-beam source of claim 11, wherein said at least one RF sputtering magnetron comprises a magnetic field generation means and a magnetron sputtering target made from a sputterable material supplied to said gaseous medium.

16. The ion-beam source of claim 2, wherein said ion-beam formation and extraction means extend along said direction of said axial length of said plasma-confining cavity; said ion-beam formation and extraction means comprising a two-electrode lateral ion-extraction lens which is formed in said hollow housing and has a first end that projects into said housing towards said plasma-confining cavity and a second end that projects radially outwardly from said hollow housing, said two-electrode lateral ion-extraction lens having a plasma-extraction slit open into said plasma-confining cavity and extending substantially along entire length of said hollow housing in a direction said axial length, said two-electrode lateral ion-extraction lens having a first electrode which comprises a part of said housing and is under potential of said anode and a second electrode which is located inside said first electrode is under a ground potential.

17. The ion-beam source of claim 16, wherein said at least two individual microwave generators comprise a plurality of individual microwave generators arranged sequentially in alternating order on opposite sides of said hollow housing with shift in said direction of said axial length, said at least two microwave energy pumping units comprising a plurality of microwave energy pumping units and each of said microwave energy pumping units of said plurality comprising at least one reactive element required for adjusting energetic link between a respective individual microwave generator of said plurality and said plasma-confining cavity.

18. The ion-beam source of claim 17, wherein said gaseous medium is a neutral gas and wherein said ion-beam source further comprising at least one RF sputtering magnetron connected to said RF energy supply means.

19. The ion-beam source of claim 18, further comprising means for cleaning said at least one window from contamination.

20. The ion-beam source of claim 19, wherein said at least one window comprises a metal rod of a round cross section having a through window extending in said direction of said axial length, and means for sealing said plasma-confining cavity comprises a reciprocating and rotating tubular body which is transparent to said microwave energy and into which said metal rod is slidingly inserted.

21. The ion-beam source of claim 20, wherein said means for cleaning comprises a mechanism for rotating said tubular body and reciprocating thereof in said direction of said axial length, and means for removing contaminants from the surface of said tubular body.

22. The ion-beam source of claim 21, wherein said means for removing contaminants comprise a sand-blast mechanism.

23. A method of generating an ion beam for use in an ion implanter, comprising the steps of: providing an ion-beam source comprising a sealed plasma-confining cavity having an axial length, evacuating means for evacuating said sealed plasma-confining cavity, gaseous medium supply means for supplying a gaseous medium into said plasma-confining means, magnetic field generating means for generating a magnetic field in said sealed plasma-confining cavity, microwave energy pumping means for pumping a microwave energy into said sealed plasma-confining cavity, at least one window extending substantially along said axial length of said plasma-confining cavity and sealing said plasma-confining cavity, said at least one window being transparent to said microwave energy generated by said microwave energy pumping means, RF energy pumping means for pumping RF energy into said plasma-confining cavity, and means for cleaning said at least one window from contaminants; evacuating said sealed plasma-confining cavity by said evacuating means; supplying a gaseous medium into said sealed plasma-confining cavity by said gaseous medium supply means; generating a magnetic field in said sealed plasma-confining cavity by said magnetic field generating means; pumping a microwave energy into said sealed plasma-confining cavity by said microwave energy pumping means via said at least one window; pumping RF energy into said plasma-confining cavity by said RF energy pumping means; developing conditions of electron-cyclotron resonance consumption of said microwave energy in said sealed plasma-confining cavity; generating a gaseous plasma in said gaseous medium in said sealed plasma-confining cavity; extracting ions from said plasma in a radial outward direction of said plasma-confining cavity and forming an ion beam for use in said ion implanter; and cleaning said windows from said contaminants.

24. The method of claim 23, further comprising a step of maintaining uniform density of said ion beam in the direction of said axial length by adjusting an energetic link between said microwave energy pumping means and said plasma-confining cavity in the direction of said axial length.

25. The method of claim 23, further providing said ion-beam source with at least one RF sputtering magnetron having a target of a sputterable material suitable for implantation with the use of said ion implanter, said gaseous medium comprising a neutral gas, said method further comprising the steps of supplying RF energy to said RF sputtering magnetron, sputtering said sputterable material to form sputtered particles, supplying said sputtered particle into said plasma, ionizing said sputterable particles, and extracting an ion beam from said plasma for use in said ion implanter.

* * * * *